US006727031B2

(12) United States Patent
Shimada et al.

(10) Patent No.: US 6,727,031 B2
(45) Date of Patent: Apr. 27, 2004

(54) INFRARED-SENSITIVE IMAGE FORMING MATERIAL

(75) Inventors: Kazuto Shimada, Shizuoka-ken (JP); Kazuto Kunita, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 130 days.

(21) Appl. No.: 09/765,292

(22) Filed: Jan. 22, 2001

(65) Prior Publication Data

US 2001/0026900 A1 Oct. 4, 2001

(30) Foreign Application Priority Data

Jan. 24, 2000 (JP) ....................................... 2000-013774
Dec. 1, 2000 (JP) ....................................... 2000-366559

(51) Int. Cl.[7] .......................... G03F 7/004; G03F 7/021

(52) U.S. Cl. .................... 430/138; 430/175; 430/270.1; 430/302

(58) Field of Search ................................ 430/176, 302, 430/175, 138, 270.1

(56) References Cited

U.S. PATENT DOCUMENTS

| | | | | |
|---|---|---|---|---|
| 4,708,925 A | | 11/1987 | Newman | |
| 4,898,803 A | * | 2/1990 | Aoai et al. | 430/166 |
| 5,141,838 A | * | 8/1992 | Aoshima et al. | 430/191 |
| 5,948,599 A | | 9/1999 | Gardner et al. | |

FOREIGN PATENT DOCUMENTS

| | | |
|---|---|---|
| EP | 0625728 | 11/1994 |
| EP | 0 795 998 A1 | 9/1997 |
| FR | 2006847 | 1/1970 |
| JP | 7-20629 | 1/1995 |
| JP | 08-276558 | 10/1996 |
| WO | WO98/53994 | 12/1998 |

* cited by examiner

*Primary Examiner*—John S. Chu
(74) *Attorney, Agent, or Firm*—Burns Doane Swecker & Mathis LLP

(57) ABSTRACT

An infrared-sensitive image forming material with which a plate can be directly formed by an infrared laser. The infrared-sensitive image forming material has a support having disposed thereon a recording layer whose solubility in an aqueous alkaline solution is altered by irradiation with an infrared laser. The recording layer has a binder phase formed of a polymer compound, a dispersion phase that is dispersed in the binder phase, and an infrared absorbent present in either one of the binder phase and the dispersion phase. Within a total incorporated amount of the infrared absorbent in the recording layer, a mass present in the dispersion binder is greater than a mass present in the binder phase. Namely, within the recording layer, the infrared absorbent is localized in the dispersion phase.

20 Claims, No Drawings

INFRARED-SENSITIVE IMAGE FORMING MATERIAL

BACKGROUND OF THE INVENTION

1. Field of the Invention

The present invention relates to an infrared-sensitive image forming material which can be used for planographic printing plates, color proofs, photoresists or color filters and, particularly, to a negative or positive type infrared-sensitive image forming material which can be used as a plate material for planography, which enables so-called direct plate formation in which a plate can be formed directly by scanning an infrared laser based on digital signals from a computer or the like.

2. Description of the Related Art

The development of lasers in recent years has been remarkable. In particular, high-output, compact solid-state lasers and semiconductor lasers that emit infrared light having wavelengths ranging from 760 nm to 1200 nm (occasionally referred to as an "infrared laser" hereinafter) have become readily available. These infrared lasers are extremely useful as a recording light source at the time a printing plate is formed directly on the basis of digital data from a computer or the like. Accordingly, demand for photosensitive resin compositions whose sensitivity to such an infrared recording light source is high has been rising in recent years. Namely, there is an increasing demand for photosensitive resin compositions in which a photochemical reaction or the like occurs upon being irradiated with an infrared beam to thereby greatly change the solubility of the photosensitive resin composition in a developing solution.

Examples of such photosensitive resin compositions that are recordable by an infrared laser include the recording material formed of an onium salt, a phenol resin and a spectral sensitizer disclosed in U.S. Pat. No. 4,708,925. This photosensitive resin composition is a positive-type, photosensitive resin composition that utilizes an effect, generated by the onium salt and the phenol resin, that deters dissolution in a developing solution.

On the other hand, examples of negative-type, photosensitive resin compositions include the recording material disclosed in Japanese Patent Application Laid-Open (JP-A) No. 8-276558. This recording material is formed of a substance that absorbs light to generate heat, an alkali-soluble resin, and a specific phenol derivative having in the molecules thereof 4 to 8 benzene nuclei.

Although these recording materials convert laser light into heat and use this heat as recording energy, sensitivity to laser exposure in each case has been insufficient.

Namely, there have been problems in that, with regard to positive-type image forming materials, inhibition to developability in an alkali developing solution cannot be sufficiently removed by heat and, with regard to negative-type image forming materials, even though acids or radicals are generated by heat, generative effectiveness is low because the heat ends up being diffused. Measures have been investigated that increase a compounding amount of infrared absorbents in order to improve the effectiveness of light/heat conversion. However, there has been the apprehension that when the compounding amount of infrared absorbents is increased, light permeability of the recording layer will deteriorate, it will become difficult for the infrared laser to penetrate the deep portion of the recording layer, and image discrimination will deteriorate. For this reason, not only is there the problem of sensitivity, but there is also the problem that it is difficult for ON-OFF in end portions of an obtained image to achieve clarity. Therefore, improvements in sensitivity and in the discrimination of an image to be formed have been desired.

SUMMARY OF THE INVENTION

An object of the present invention is to provide an infrared-sensitive image forming material with which a plate can be formed directly from digital data of a computer or the like using a solid laser or a semiconductor laser that emits an infrared beam, whose sensitivity to an infrared laser is high, and with which discrimination of a formed image is excellent.

The above object of the present invention can be achieved by an infrared-sensitive image forming material comprising a support and a recording layer disposed thereon whose solubility in an aqueous alkaline solution is altered by irradiation with an infrared laser, wherein the recording layer has a binder phase formed of a polymer compound, a dispersion phase that is dispersed in the binder phase, and an infrared absorbent present in either one of the binder phase and the dispersion phase, and within a total incorporated amount of the infrared absorbent in the recording layer, a mass present in the dispersion binder is greater than a mass present in the binder phase.

In one aspect of the infrared-sensitive image forming material, the mass of the infrared absorbent present in the dispersion phase is no less than 70% by mass of the total incorporated amount of the infrared absorbent in the recording layer.

In another aspect of the infrared-sensitive image forming material, the dispersion phase comprises a polymer compound that is incompatible with the polymer compound forming the binder phase.

In another aspect of the infrared-sensitive image forming material, the dispersion phase may be one of a latex and a microcapsule.

In another aspect of the infrared-sensitive image forming material, the dispersion phase has a configuration in which a maximum length is 0.1 $\mu$m to 0.8 $\mu$m and an average length is 0.05 $\mu$m to 0.6 $\mu$m.

In another aspect of the infrared-sensitive image forming material, at least one of the binder phase and the dispersion phase comprises a polymer compound that is insoluble in water and soluble in an aqueous alkaline solution, the recording layer has a compound in which one of an acid and a radical is generated by irradiation with an infrared laser, and at least one of the binder phase and the dispersion phase comprises a polymer compound whose solubility in an aqueous alkaline solution is changed by an action of one of the acid and the radical.

In another aspect of the infrared-sensitive image forming material, at least one of the binder phase and the dispersion phase comprises a polymer compound that is insoluble in water and soluble in an aqueous alkaline solution, the recording layer has a compound in which one of an acid and a radical is generated by irradiation with an infrared laser, and at least one of the binder phase and the dispersion phase comprises a polymer compound in which one of polymerization and a cross-linking reaction occurs by an action of one of the acid and the radical to lower solubility in an aqueous alkaline solution.

In another aspect of the infrared-sensitive image forming material, at least one of the binder phase and the dispersion phase comprises a polymer compound that is insoluble in water and soluble in an aqueous alkaline solution, and the infrared absorber comprises a polymer compound that is an onium salt in which a solubility of at least one of the binder phase and the dispersion phase in an aqueous alkaline solution is raised by irradiation with a infrared laser.

In another aspect of the infrared-sensitive image forming material, the binder phase comprises a polymer compound that is insoluble in water and soluble in an aqueous alkaline solution, and the dispersion phase has a composition whose solubility in an aqueous alkaline solution is changed by irradiation with an infrared laser.

In another aspect of the infrared-sensitive image forming material, the recording layer has a compound that is cross-linked by an action of one of an acid and a radical, and with which a negative-type image can be formed by the recording layer being hardened by irradiation with an infrared laser.

In another aspect of the infrared-sensitive image forming material, the binder phase comprises a polymer compound that may be selected from a urethane polymer compound, an acryl polymer compound, a styrene polymer compound, a novolac resin, a diazo resin, an amide polymer compound and a polyether compound.

In another aspect of the infrared-sensitive image forming material, the dispersion phase comprises a polymer compound that may be selected from a urethane polymer compound, an acryl polymer compound, a styrene polymer compound, a novolac resin, a diazo resin, an amide polymer compound and a polyether compound.

In another aspect of the the infrared-sensitive image forming material, the binder phase may comprise a novolac resin and the dispersion phase may comprise one of a latex and a microcapsule.

In another aspect of the infrared-sensitive image forming material, the binder phase may comprise a urethane polymer compound and the dispersion phase may comprise a styrene polymer compound.

In another aspect of the infrared-sensitive image forming material, the binder phase may comprise an acryl compound and the dispersion phase comprises a polymer compound that may be selected from a urethane polymer compound, a styrene polymer compound, a novolac resin and a diazo resin.

The present invention has the advantage that a binder phase surrounding a dispersion phase plays an important role in the production of an insulating effect to prevent the dissipation of heat, whereby a reaction caused by heat can be initiated and run efficiently by localizing an infrared absorber, which is a light/heat conversion material, and a component, which reacts by heat, as the dispersion phase in a recording layer. Also, the localization of a component such as the infrared absorber having a low light transmittance more improves light transmittance even in the case where the same amount is compounded in contrast with the case where the infrared absorber is uniformly dispersed. Therefore, an infrared laser extends deep in the recording layer, bringing about the advantage that a sharp image having clear ON-OFF in the end portion is obtained.

For example, by localizing an infrared absorber and an acid-generating agent or a polymerization initiator (hereinafter referred simply to as an initiator as required), a composition (binder phase) surrounding a dispersion phase plays a role of an insulating layer. Hence the dissipation of heat is prevented and the initiator can be decomposed efficiently. In the positive type, a compound which is changed in a solubility in an alkali by irradiation with an infrared laser is localized as a dispersion phase, whereby the binder phase surrounding the dispersion phase prevents the dissipation and diffusion of heat and this makes it possible to change the alkali developing ability efficiently. In the negative type, an infrared absorber and an initiator are localized in a dispersion phase, whereby the decomposition of the initiator is caused efficiently and a polymerization or crosslinking reaction proceeds promptly. Also, in the case of the positive type, the dissolution-inhibitive effect can be eliminated efficiently by localizing a light-heat conversion material and a compound which is changed in alkali solubility by infrared rays in the dispersion phase.

Incidentally, the "infrared sensitivity" in the present invention means that the light-sensitive material is "responsive to a heat-mode", specifically, a recording in the light-sensitive material can be made by heat-mode exposure. The definition of the heat-mode exposure in the present invention will be explained in detail. As described in Hans-Joachim Timpe, IS & Ts NIP 15: 1999 International Conference on Digital Printing Technologies. P.209, it is known that when a photo-absorptive material (e.g., a dye) in a light-sensitive material is photo-excited to form an image through a chemical or physical change, there are two modes, when roughly classified, in the process from the photo-excitation of the light-absorbing material up to the chemical or physical change. One of these modes is a photon mode in which the photo-excited photo-absorptive material loses its activity by some photochemical interaction (e.g., energy-transfer or electron-transfer) with other reactive materials and the reactive materials which is consequently activated cause the aforementioned chemical or physical change required for the formation of an image. The other is a heat-mode in which the photo-excited photo-absorptive material generates heat to lose its activity and the reactive materials cause the aforementioned chemical or physical change required for the formation of an image by heat. Besides the above modes, there are other specialized modes including an ablation mode in which a substance is scattered by the energy of light which is locally concentrated and a multiple photon absorption mode in which one photon absorbs a number of photons at a time, though explanations of these modes are omitted here.

Exposure processes utilizing each of the aforementioned modes are referred to as photon mode exposure and heat mode exposure respectively. A technical difference between the photon mode exposure and the heat mode exposure is based on whether or not the quantity of energy of a certain number of photons can be summed up when it is used for the reaction energy to be intended. The following discussion will be made on the supposition that, for example, n photons are used to cause a certain reaction. Because, in the photon mode exposure, a photochemical interaction is utilized, each of the energy of one photon to be utilized cannot be summed up by the request of the law of conservation of energy and momentum. Namely, the relation "the quantity of the energy of one photon≧the quantity of reaction energy" must be established to cause some reaction. On the other hand, in the heat mode exposure, the summing-up of the quantity of energy is made possible since heat is generated after the photo-excitation and the light energy is converted to heat and utilized. Therefore, it is only required in this mode that the relation "the quantity of the energy of n photons≧the quantity of reaction energy" is established. However, this summing-up of the quantity of energy is restricted by thermal diffusion. Specifically, if the next photo-excitation/deactivation stage commences before heat is dissipated by thermal diffusion from the exposed portion (reaction point)

on which an attention is now focused, the heat is certainly accumulated and summed-up, leading to a rise in the temperature of the portion. However, in the case where the next generation of heat is delayed, the heat is dissipated without being accumulated. Namely, in the heat mode exposure, the results obtained respectively in the case of applying high energy light in a short time and in the case of applying low energy light for a long time are different from each other even if the total exposure value in each case is the same and the former case is advantageous in the accumulation of heat.

In the photon mode exposure, such a phenomenon does not basically occur, of course, though there is the case where a similar phenomenon occurs due to the effect of the diffusion of successive reactive groups.

Specifically, viewing from the characteristics of the light-sensitive material, the intrinsic sensitivity (the quantity of energy required for the formation of an image) of the light-sensitive material is made constant to the power density of exposure ($w/cm^2$) (=the density of energy per unit time) in the photon mode, but the intrinsic sensitivity of the light-sensitive material is increased with respect to the power density of exposure in the heat mode. Therefore, in the case of comparing these modes with each other when exposure time is fixed actually at a level enough to maintain the productivity required for a practical image recording material, the following results are obtained. Specifically, in the photon mode exposure, a sensitivity as high as about 0.1 $mJ/cm^2$ can be achieved in general, but the reaction is run however small the exposure value is and therefore the problem of low exposure fogging in the unexposed portion tends to be caused. On the contrary, in the heat mode exposure, although no reaction is run if the exposure value is not greater than a prescribed value and an exposure value of 50 $mJ/cm^2$ is usually required relative to the thermal stability of the light-sensitive material, the problem of low exposure fogging is avoided.

In the heat mode exposure, practically, the power density of exposure at the plane of the light-sensitive material must be 5000 $w/cm^2$ or more and preferably 10000 $w/cm^2$ or more. However, though not mentioned in detail here, the use of a laser with a power density as high as $5.0\times10^5/cm^2$ or more cause ablation, giving rise to the problem of contamination to a light source and is therefore undesirable.

DETAILED DESCRIPTION OF THE PREFERRED EMBODIMENTS

An infrared-sensitive image forming material according to the present invention (hereinafter referred simply to as image forming material as required) comprises a support and a recording layer which is disposed on the support and changed in solubility in an aqueous alkaline solution by irradiation with an infrared laser, wherein the recording layer contains a binder phase consisting of a polymer compound, a dispersion phase dispersed in the binder phase and an infrared absorber present in either the binder phase or the dispersion phase and the infrared absorber is localized in the dispersion phase.

In the image forming material of the present invention, the recording layer has a dispersion phase. The dispersion phase can be formed in accordance with the following embodiments.

In a first embodiment, two or more types of polymer compounds which are mutually incompatible are used to form a binder phase that becomes a mother material (matrix), namely, a dispersion medium. In this case, the polymer compounds that are mutually incompatible respectively structure the binder phase and the dispersion phase. In the binder phase, a spherical or oblate spherical dispersion phase is formed.

In a second embodiment, a dispersion phase having predetermined components is formed in advance using a microcapsule or a latex and then introduced into a binder phase composed of a polymer compound.

The first embodiment will now be described.

At least one polymer that is insoluble in water and soluble in an aqueous alkaline solution may be used as the two or more types of mutually incompatible polymer compounds usable in the first embodiment. It is preferable that this is a polymer compound forming the binder phase. Here, the phase "mutually incompatible" means that a combination of two or more polymers does not form a solid or liquid of one phase in appearance. This may be confirmed by appropriately processing a cross-section or the like of the recording layer, observing the cross-section with the eye or photographing the cross-section with a scanning electron microscope and observing the cross-section.

Examples of the mutually incompatible polymer compounds that may be used in combination of two or more types include urethane polymer compounds, acrylic polymer compounds, styrene type polymer compounds, novolak resins, diazo resins, amide type polymer compounds and polyether compounds. Preferable examples of combinations that may be used in a negative type image recording layer include a combination of an acrylic polymer compound and an urethane type polymer compound and a combination of an acrylic or urethane type polymer compound and a diazo resin. Preferable examples of combination that may be used in the positive type recording layer include a combination of a diazo resin and an acrylic or urethane type polymer compound. Combinations that have a urethane polymer compound are preferable from the standpoint of low susceptibility to damage at the time of development.

These two or more types of polymer compounds and the infrared absorber (and other components as desired) may be dispersed and/or dissolved in a predetermined solvent to prepare a coating solution, which is then applied to a support and dried to form a recording layer. The binder phase and the dispersion phase are formed in the recording layer and a large amount of the infrared absorber is contained much in the dispersion phase. It is preferable that 70% per mass or more of the total mass of the infrared absorber contained in the recording layer be localized in the dispersion phase.

When two or more types of polymer compounds that are mutually incompatible are used to form the recording layer, the polymer compound exhibiting an interaction stronger than the hydrogen bonding and/or ionic interaction forms a spherical or oblate spherical shape to form the dispersion phase in the binder phase. Further, because the infrared absorber is ionic or a coordination complex, it is easily incorporated into the polymer compound exhibiting a high interaction. The infrared absorber is localized in the dispersion phase accordingly. Also, when an acid-generating agent or a radical-generating agent (polymerization initiator) is added, such a material is, like the infrared absorber, easily incorporated into the dispersion phase since it usually has a high polarity group such as an onium salt structure, triazine or sulfonate.

In the first embodiment, the recording layer may form an island structure formed by the binder phase and the dispersion phase. With regard to observation of the island structure, a cross-section of the recording layer obtained by cutting the recording layer with a microtome or the like is impairted with electroconductivity, and then a photograph of the section is taken using a scanning electron microscope (SEM), whereby the size of a circular or elliptical dispersion phase can be evaluated using an image analyzer. If the image is not clear when a photograph is taken, a photograph of the section of the recording layer is taken after it is treated by solvent etching according to a method described in, for example, "Polymer Alloy and Polymer Blend" (L. A. Utracki, translated by Toshio Nishi; Tokyo Kagaku Dojin), whereby a more distinct image can be obtained.

In the aforementioned island structure, the size of the dispersion phase depends upon the type of solvent to be applied and drying conditions after application. A dispersion phase having a maximum length of 0.8 μm or less and preferably 0.6 μm or less and an average length of 0.6 μm or less and preferably 0.5 μm or less can be formed by controlling these conditions. The maximum length and the average length at this time are preferably small. Although there are no particular restrictions on a lower limit for each of these lengths, generally the lower limit of the maximum length is about 0.1 μm and the lower limit of the average length is about 0.05 μm. The length is found by performing an image analysis of a dispersion particle in the manner described above. When circular, a diameter is signified, and when elliptical, a length is signified.

The localization of the infrared absorber can be confirmed by the following. Specifically, only the dispersion phase is extracted using a solvent or an aqueous alkaline solution which dissolves only the dispersion phase among components forming the recording layer. Then, UV is measured to find the optical density of the dispersion phase. The optical density obtained is compared with the optical density in the whole matrix having the polymer binder to measure the amount of the infrared absorber contained in the dispersion phase.

In the present invention, the selection of the solvent to be applied is an important factor to allow the dispersion phase of the island structure to have a maximum length of 0.8 μm or less and an average length of 0.6 μm or less. The use of a proper solvent to be applied makes it possible to prepare an island structure having an intended size. A clear theory with regard to the dispersion phase being made small by the selection of the type of solvent to be applied has not been found. However, the solvent to be applied include a ketone such as cyclohexanone or methyl ethyl ketone, an alcohol such as methanol, ethanol, propanol or 1-methoxy-2-propanol, a cellosolve such as ethylene glycol monomethyl ether, a lactone such as γ-butyrolactone, a sulfoxide such as dinmethylsulfoxide or sulfolane, a halogen such as ethylene dichloride, an acetate such as 2-methoxyethyl acetate or 1-methoxy-2-propyl acetate, an ether such as dimethoxyethane, an ester such as methyl lactate or ethyl lactate, an amide such as N,N-dimethoxyacetamide or N,N-dimethylformamide, a pyrrolidone such as N-methylpyrrolidone, a urea such as tetramethylurea or aromatic type such as toluene. Among these, methyl ethyl ketone, 1-methoxy-2-propanol, ethylene glycol monomethyl ether, γ-butyrolactone and dimethylsulfoxide are preferred. These solvents may be used either singly or as a mixture.

In addition to the aforementioned type of solvent to be applied, the conditions in which an indried coating film is dried after a photosensitive liquid has been applied thereto are known to be an important factor in preparing a dispersion phase having a given size in the island structure of the recording layer. For the production of such an island structure, a description in JP-A 9-90610 may be cited for reference.

When two or more types of mutually incompatible polymer compounds are used to form the polymer matrix and the dispersion phase, polymer compounds that may be used to form the dispersion phase are shown below.

Examples of the polymer compounds used in the present invention include copolymers having a structural unit derived from at least one of monomers corresponding to the following (1) to (5), or urethane type polymer compounds, novolac resins, diazo resins and polyethers.

(1) Acrylamides, methacrylamides, acrylates and methacrylates having an aromatic hydroxyl group. Specific examples include N-(4-hydroxyphenyl)acrylamide or N-(4-hydroxyphenyl)methacrylamide, o-, p- or m-hydroxyphenylacrylate or methacrylate and 2-hydroxyethylmethacrylate.

(2) Unsaturated carboxylic acid such as acrylic acid, methacrylic acid, maleic anhydride and itaconic acid.

(3) Low molecular compounds having one or more sulfonamide groups in which at least one hydrogen atom is bonded to a nitrogen atom and one or more unsaturated bonds in a molecule, for example, compounds represented by the following formulae (I) to (V).

(I)

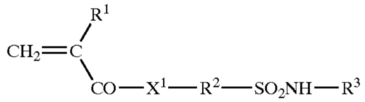

(II)

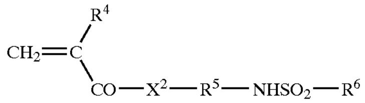

(III)

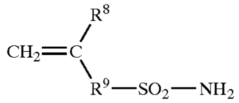

(IV)

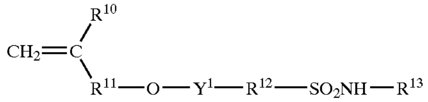

(V)

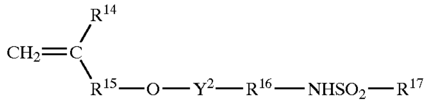

In the formulae, $X^1$ and $X^2$ respectively represent —O— or —$NR^7$—, $R^1$ and $R^4$ respectively represent a hydrogen atom or —$CH_3$, $R^2$, $R^5$, $R^9$, $R^{12}$ and $R^{16}$ respectively represent an alkylene, cycloalkylene, allylene or aralkylene group which has 1 to 12 carbon atoms and may have a substituent, $R^3$, $R^7$ and $R^{13}$ respectively represent a hydrogen atom or an allyl, cycloalkyl, aryl or aralkyl group which has 1 to 12 carbon atoms and may have a substituent, $R^6$ and $R^{17}$ respectively represent an alkyl, cycloalkyl, aryl or aralkyl group which has 1 to 12 carbon atoms and may have a substituent, $R^8$, $R^{10}$ and $R^{14}$ respectively represent a hydrogen atom, a halogen atom or —$CH_3$, $R^{11}$ and $R^{15}$ respectively represent a single bond or an alkylene, cycloalkylene, allylene or aralkylene group which has 1 to 12 carbon atoms and may have a substituent and $Y^1$ and $Y^2$ respectively represent a single bond or —CO—.

Specific examples of these compounds include m-aminosulfonylmethacrylate, N-(p-aminosulfonylphenyl) methacrylamide and N-(p-aminosulfonylphenyl) acrylamide.

(4) Low molecular compounds having one or more active imino groups represented by the following formula (VI) and one or more polymerizable unsaturated bonds in one molecule. Examples of these compounds include N-(p-toluenesulfonyl)methacrylimide and N-(p-toluenesulfonyl) acrylimide.

(VI)

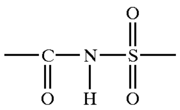

(5) Styrene type compounds or vinylacetic acid or vinyl alcohol. Examples of these compounds include o-, m- or p-hydroxystyrene, styrene p-sulfonate and o-, m- or p-carboxylstyrene.

Monomers corresponding to the above (1) and (5) may be used singly or in combinations of two or more. It is preferable that these monomers be combined with monomers other than the above (1) to (5) monomers to form copolymers. In this case, it is preferable for the monomers to have structural units derived from monomers represented by the above (1) to (5) in an amount of 10 mol % or more, preferably 20 mol % or more and more preferably 25 mol % or more. Examples of the monomers to be combined with the monomers represented by the above (1) to (5) include those described in the following (6) to (16).

(6) Acrylates and methacrylates having an aliphatic hydroxyl group, for example, 2-hydroxyethylacrylate or 2-hydroxyethylmethacrylate.

(7) (Substituted) alkylacrylates such as methylacrylate, ethylacrylate, propylacrylate, butylacrylate, amylacrylate, hexylacrylate, octylacrylate, benzylacrylate, 2-chloroethylacrylate, glycidylacrylate and N-dimethylaminoethylacrylate.

(8) (Substituted) alkylmethacrylates such as methylmethacrylate, ethylmethacrylate, propylmethacrylate, butylmethacrylate, amylmethacrylate, hexylmethacrylate, cyclohexylmethacrylate, benzylmethacrylate, glycidylmethacrylate and N-dimethylaminoethylmethacrylate.

(9) Acrylamides or methacrylic acid amides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethy1-N-phenylacrylamide.

(10) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(11) Vinyl esters such as vinyl acetate, vinyl chloroacetate, vinyl butylate and vinyl benzoate.

(12) Styrenes such as styrene, α-methylstyrene, methylstyrene and chloromethylstyrene.

(13) Vinyl ketones such as methyl vinyl ketone, ethyl vinyl ketone, propyl vinyl ketone and phenyl vinyl ketone.

(14) Olefins such as ethylene, propylene, isobutylene, butadiene and isoprene.

(15) N-vinylpyrrolidone, N-vinylcarbazole, 4-vinylpyridine, acrylonitrile, methacrylonitrile and the like.

(16) Unsaturated imides such as maleimide, N-acryloylacrylamide, N-acetylmethacrylamide, N-propionylmethacrylamide and N-(p-chlorobenzoyl) methacrylamide.

Further, a monomer that can be copolymerized with these monomers may be copolymerized. Polymer compounds having a weight average molecular weight of 2000 or more and a number average molecular weight of 1000 or more are preferably used. Those having a weight average molecular weight of 5000 to 300000, a number average molecular weight of 2000 to 250000 and an angular dispersion (weight average molecular weight/number average molecular weight) of 1.1 to 10 are more preferable.

Examples of urethane type polymer compounds that are insoluble in water and soluble in an aqueous alkaline solution and can be used in the present invention include, though not limited to, the urethane polymer compounds disclosed in JP-A 63-124047, JP-A 63-287946, JP-A 2-866 and JP-A 2-156241.

In the present invention, the aforementioned acrylic polymer compound and urethane polymer compound may be combined.

Examples of the alkali-soluble novolac resin used in the present invention may include alkali-soluble novolac resins such as phenolformaldehyde resins, m-cresolformaldehyde resins, p-cresolformaldehyde resins, m-/p-mixed cresolformaldehyde resins and phenol/cresol (any of m-, p- and m-/p-mixtures may be used) mixed formaldehyde resins. Alkali-soluble novolac resins, those having a weight average molecular weight of 500 to 20000 and a number average molecular weight of 200 to 10000 are used. As disclosed in U.S. Pat. No. 4,123,279, a condensate of a phenol, having an alkyl group having 3 to 8 carbon atoms as a substituent, and a formaldehyde such as a t-butylphenolformaldehyde resin or octylphenolformaldehyde resin may be combined.

As the diazo resin used in the present invention, diazo resins, namely, polymers or oligomers having a diazonio group on the side chain, are preferably used from the viewpoint of high film strength at exposed portions. Particularly, diazo resins which are condensates of an aromatic diazonium salt and, for example, an active carbonyl-containing compound (e.g., formaldehyde) may be used. Preferable diazo resins are reaction products of a negative ion and a condensate obtained by condensing a diazo monomer and a condensing agent in a ratio by mol of 1:1 to 1:0.5 and preferably 1:0.8 to 1:0.6 by using a usual method. Examples of the diazo monomer include 4-diazo-diphenylamine, 1-diazo-4-N, N-dimethylaminobenzene, 1-diazo-4-N,N-diethylaminobenzene, 1-diazo-4-N-ethyl-N-hydroxyethylaminobenzene, 1.-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazophenylamine, 3-n-propoxy)-4-diazodiphenylamine and 3-isopropoxy-4-diazodiphenylamine. Examples of the condensing agent include formaldehyde, acetaldehyde, propionaldehyde, butyraldehyde, isobutyraldehyde and benzaldehyde.

Examples of the negative ion used in the reaction may include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, di-t-butylnaphthalenesulfonic acid, 1-naphthol-5-sulfonic acid, 2-methoxy-4-hydroxy-5-benzoyl-benzenesulfonic acid and paratoluenesulfonic acid. Among these compounds, alkyl aromatic sulfonic acid such as hexafluorophosphoric acid, triisopropylnaphthalenesulfonic acid and 2,5-dimethylbenzenesulfonic acid are preferred.

Reaction products of a condensate obtained from the aforementioned diazo monomer and a carboxylic acid and/or an aldehyde having a phenol or its acetal (or the aforementioned condensing agent according as needed) with the aforementioned negative ion and diazo resins disclosed in the specification of each of JP-A 1-102456 and JP-A 1-102457 are also preferably used in the present invention. Diazo resins having a carboxylic acid group are particularly preferable because developability is improved and, as a result, it becomes difficult for contamination to be generated at non-image portions at the time of printing.

Among these diazo resins, diazo resins having a structural unit represented by the following formula (1) or structural units represented by the formulae (1) and (2) and a weight average molecular weight of 500 or more, preferably 800 or more and more perfectly 1000 or more, are most preferable from the standpoint of excellent decomposability by heat generated from light and excellent storage stability of the image recording material. When the weight average molecular weight is less than 500, film strength of image portions is lowered. The ratio (by weight) of the structural units represented respectively by the formulae (1) and (2) is preferably 100:0 to 30:70. When the amount of the structural unit represented by the formula (1) is small, the strength of image portions is reduced. In addition, other structural units may be incorporated.

(1)

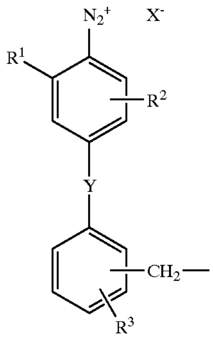

(2)

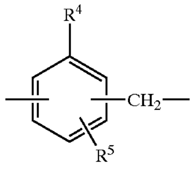

In the formulae, $R^1$, $R^2$, $R^3$, $R^4$ and $R^5$ respectively represent a hydrogen atom, a halogen (e.g., fluorine, chlorine or bromine), —COOH, —$OPO_3H_2$, —$PO_3H_2$—, —$SO_3H$, —OH or a hydrocarbon group (e.g., a carboxymethyl group, hydroxyethyl group or p-carboxymethoxyphenyl group), alkoxy group (e.g., a methoxy group, hexyloxy group or carboxymethoxy group) or aryloxy group (e.g., a phenoxy group or p-carboxymethoxyphenoxy group) which has 15 or less carbon atoms and may have a substituent (e.g., —COOH, —$OPO_3H_2$, —$PO_3H_2$—, —$SO_3H$ or —OH), Y represents $NR^6$, O or S wherein $R^6$ represents a hydrogen atom or a hydrocarbon group (e.g., a methyl group, ethyl group or hexyl group) having 12 or less carbon atoms, $X^-$ represents $PF_6^-$ or a benzene sulfonate or naphthalene sulfonate which has 20 or less carbon atoms and may have a substituent wherein examples of the substituent may include a methyl group, butyl group (including n-, i-, sec- and t-butyl groups), hexyl group, decyl group, dodecyl group or benzoyl group.

In the case of a positive type recording layer, a compound whose solubility in an aqueous alkaline solution is raised by heat may be incorporated in the dispersion phase at a high amount, together with the infrared absorber. By so doing, the solubility of exposed portions of the image with respect to an aqueous alkaline solution can be efficiently improved. Further, in the case of a negative type recording layer, an initiator may be incorporated in the dispersion phase, together with the infrared absorber. By so doing, an acid or radical may be efficiently generated from the initiator, whereby hardening in exposed portions of the recording layer is further accelerated.

Next, a second embodiment will be described.

In the second embodiment, the dispersion phase is formed of a latex or a microcapsule. The microcapsule usable in the present invention can be easily prepared by the method disclosed in the Examples of JP-A 1-145190 or the methods described in *Shinpan Maikurokapuseru: Sono Seihô, Seishitsu, Ôyô* ("Microcapsules: Methods of Production, Properties and Application, New Edition", published by Sankyô). The latex, or latex that can be produced according to methods disclosed or described in JP-A 10-265710, JP-A 10-270233, JP-A 5-2281, *Kôbunshi Ratekkusu no Kagaku* (Polymer Latex Chemistry", published by Kôbunshi Kankôkai) and *Kôbunshi Ratekkusu* ("Polymer Latex", published by Shinkôbunshi Bunko) may also be used.

Examples of substances to be encapsulated in the microcapsule and substances to be incorporated in the latex include initiators such as acid generating agents and radical generating agents, crosslinking agents, as well as the infrared absorbers.

In the second embodiment, the compounds cited as examples of polymer compounds that may form the binder phase in the first embodiment may be used as the polymer compound which forms the binder phase.

Next, each of the compounds contained in the dispersion phase will be explained.

When the recording layer is a negative type, in order to lower the aqueous alkaline solubility of the polymer compound soluble in an aqueous alkaline solution in exposed portions, the recording layer is made to contain an acid generating agent which is decomposed by light or heat to generate an acid and an acid crosslinking agent which initiates a crosslinking reaction by the aid of the acid generated to harden the polymer compound forming the binder phase and/or the dispersion phase or a polymerization initiator which generates a radical by the aid of light or heat and a polymerizable compound (which may be a polymer compound forming the binder phase and the dispersion phase).

By acid generator is meant a compound from which an acid is generated when the compound is irradiated with light having a wavelength of 200 nm to 500 nm or higher or when the compound is heated to a temperature of 100° or higher. Examples thereof include photoinitiators for initiating photo-cationic polymerization, photoinitiators for initiating photo-radical polymerization, agents for decoloring of light of dyes, light discoloring agents, known acid generators used in microresists and the like, known compounds which decompose when heated to generate acids, and mixtures of these. Strong acids, such as sulfonic acid and hydrochloric acid, having a pKa of 2 or less are preferable as the acid to be generated.

Examples of the initiator used preferably in the present invention include the triazine type compounds disclosed in JP-A 11-95415 and the latent Bronsted acids described in JP-A 7-20629. Here, the latent Bronsted acid means a precursor which is decomposed to produce a Bronsted acid. It is believed that the Bronsted acid catalyzes a matrix-creating reaction between a resol resin and a novolac resin. Typical examples of the Bronsted acid suitable for this purpose are trifluoromethanesulfonic acid and hexafluorophosphonic acid.

Ionic latent Bronsted acids may be preferably used in the present invention. Examples of these ionic Bronsted acids include onium salts, particularly, iodonium, sulfonium, phosphonium, selenonium, diazonium and arsonium salts. Specific examples of particularly useful onium salts include diphenyliodoniumhexafluorophosphate, triphenylsulfoniumhexafluoroantimonate, phenylmethyl-ortho-cyanobenzylsulfoniumtrifluoromethane sulfonate and 2-methoxy-4-aminophenyldiazoniumhexafluorophosphate.

Nonionic latent Bronsted acids are also used appropriately in the present invention.

Examples of the nonionic latent Bronsted acid include $RCH_2X$, $RCHX_2$, $RCX_3$, $R(CH_2X)_2$ and $R(CH_2X)_3$ (wherein X represents Cl, Br, F or $CF_3SO_3$ and R represents an aromatic group, an aliphatic group or a united body of an aromatic group and an aliphatic group).

Useful ionic latent Bronsted acids are those represented by the following formula.

$$X^+R^1R^2R^3R^4W^-$$

In the formula, $R^3$ and $R^4$ respectively represent a lone electron-pair and $R^1$ and $R^2$ respectively represent an aryl group or a substituted aryl group when X is iodine, $R^4$ may be a lone electron-pair and $R^1$, $R^2$ and $R^3$ may respectively be an aryl group, a substituted aryl group, an aliphatic group or a substituted aliphatic group when X is S or Se, $R^4$ may be an aryl group, a substituted aryl group, an aliphatic group or a substituted aliphatic group when X is P or As and W represents $BF_4$, $CF_3SO_3$, $SbF_6$, $CCl_3CO_2$, $ClO_4$, $AsF_6$ or $PF_6$ or may be an acid corresponding to each of these compounds and having a pH less than 3. Any of the onium salts disclosed in U.S. Pat. No. 4,708,925 may be used as the latent Bronsted acid in the present invention. Examples of these onium salts include indonium, sulfonium, phosphonium, bromonium, chloronium, oxysulfoxonium, oxysulfonium, sulfoxonium, selenonium, telluronium and arsonium salts.

It is particularly preferable to use diazonium salts as the latent Bronsted acid in the present invention. These salts respectively provide a sensitivity equivalent to those of other latent Bronsted acids in the infrared region and a higher sensitivity than other Bronsted acids in the ultraviolet region.

In the present invention, each of these initiators is added in an amount of 0.01 to 50% by weight, preferably 0.1 to 25% by weight and more preferably 0.5 to 20% by weight based on the total solid content of the recording layer. When the amount to be added is less than 0.01% by weight, an image cannot be obtained. On the other hand, when the amount to be added exceeds 50% by weight, contamination is generated in non-image portions at the time of printing.

Also, in the present invention, the infrared absorber that is a constituent manifesting a light-heat conversion function has a function to convert the absorbed infrared rays into heat. In the negative recording material, the generated heat works, for example, to decompose an acid generating agent (described later) to generate an acid, thereby causing a crosslinking reaction in the recording layer which lower the solubility in a developing solution. Also, in the positive type recording material, the interaction between the polymer compounds constituting the binder phase and/or the dispersion phase is released, or a development inhibitor is decomposed by laser scanning to thereby increase the solubility in a developing solution. An acid is generated by the heat of the infrared absorber, thereby the solubility in a developing solution is increased.

The infrared absorber used in the present invention is a dye or pigment which effectively absorbs infrared rays having a wavelength of 760 nm to 1200 nm, and is preferably a dye or pigment which has an absorption maximum for a wavelength of 760 nm to 1200 nm.

The infrared absorber which can be preferably used when the image forming material of the present invention has a negative type recording layer will be hereinafter explained in detail.

Commercially available and known dyes described in references such as *Senryô Biran* ("Handbook of Dyes", edited by the Association of Synthetic Organic Chemistry Japan, 1970) may be used. Specific examples of these dyes include azo dyes, azo dyes of metal complex salts, pyrazolone azo dyes, naphthoquinone dyes, anthraquinone dyes, phthalocyanine dyes, carbonium dyes, quinoneimine dyes, methine dyes, cyanine dyes, squalilium dyes, pyrylium salts and metal thiolate complexes.

Preferable examples of these dyes include the cyanine dyes disclosed in JP-A 58-125246, JP-A 59-84356, JP-A 59-202829 and JP-A 60-78787, the methine dyes disclosed in JP-A 58-173696, JP-A 58-18 1690 and JP-A 58-194595, the naphthoquinone dyes disclosed in JP-A 58-112793, JP-A 58-224793, JP-A 59-48187, JP-A 59-73996, JP-A 60-52940 and JP-A 60-63744, the squarylium dyes disclosed in JP-A 58-112792, and the cyanine dyes disclosed in U.K. Patent No. 434,875.

Also, the near infrared absorbing sensitizers in U.S. Pat. No. 5,156,938 are preferably used. The substituted arylbenzo(thio)pyrylium salts disclosed in U.S. Pat. No. 3,881,924, the trimethinethiapyrylium salts disclosed in JP-A 57-142645 (U.S. Pat. No. 4,327,169), the pyrylium type compounds disclosed in JP-A 58-181051, JP-A 58-220143, JP-A 59-41363, JP-A 59-84248, JP-A 59-84249, JP-A 59-146063 and JP-A 59-146061, the cyanine dyes disclosed in JP-A 59-216146, the pentamethinethiopyrylium salts disclosed in U.S. Pat. No. 4,283,475, and the pyrylium compounds disclosed in Japanese Patent Application Bulletin (JP-B) No. 5-13514 and JP-B No. 5-19702 are also preferably used.

Other preferable examples of the dye include the near infrared absorbing dyes represented by the formulae (I) and (II) in U.S. Pat. No. 4,756,993.

Among these dyes, particularly preferable examples may include cyanine dyes, squalilium dyes, pyrylium salts and nickel thiolate complexes.

Examples of pigments that may be used in the present invention include commercially available pigments and pigments described in the *Color Index* (C.I.) catalog, *Saishin Ganryô Binran* ("Recent Pigment Catalog" (edited by the Japan Pigment Technology Association, 1977), *Saishin Ganiyô Ôyô Gijutsu* ("Recent Pigment Application Technology", published by CMC, 1986), and *Insatsu Inki Gijutsu* ("Ink Printing Technology", published by CMC, 1984).

Examples of the pigment include black pigments, yellow pigments, orange pigments, brown pigments, red pigments, violet pigments, blue pigments, green pigments, fluorescent pigments, metal powder pigments, other pigments and polymer bond dyes. Specifically, insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dying lake pigments, azine pigments, nitroso pigments, nitro pigments, natural pigments, fluorescent pigments, inorganic pigments and carbon black may be used.

These pigments may be used without surface treatment or after a surface treatment has been administered thereto. Examples of surface treatment methods include a method in which the surface is coated with a resin or wax, a method in which a surfactant is adhered, and a method in which a reactive substance (e.g., a silane coupling agent, an epoxy compound, polyisocyanate and the like) is bonded to the pigment surface. These surface treatment methods are described in *Kinzoku Sekken no Seishitsu to Ôyô* ("Properties and Application of Metallic Soap", published by Saiwai Shobô), *Insatsu Inki Gijutsu* ("Ink Printing Technology", published by CMC, 1984), and *Saishin Ganryô Ôyô Gijutsu* ("Recent Pigment Application Technology", published by CMC, 1986).

The particle diameter of the pigment is in a range from preferably 0.01 $\mu$m to 10 $\mu$m, more preferably 0.05 $\mu$m to 1 $\mu$m and particularly preferably 0.1 $\mu$m to 1 $\mu$m. A pigment particle diameter less than 0.01 $\mu$m is unpreferable in view of the stability of dispersed materials in the coating solution for the image recording layer. On the other hand, a particle diameter exceeding 10 $\mu$m is unpreferable in view of the uniformity of the image recording layer.

Known dispersion techniques used for the production of ink or a toner may be used as a method of dispersing the pigment. Examples of dispersing machines include an ultrasonic dispersion machine, a sand mill, an attritor, a pearl mill, a super mill, a ball mill, an impeller, a disperser, a KD mill, a colloid mill, a dynatron, a three-roll mill and a pressure kneader may be given. Details are described in *Saishin Ganryô Ôyô Gijutsu* ("Recent Pigment Application Technology", published by CMC, 1986).

In the case of a negative type recording layer, the infrared absorber is preferably a dye. Particularly preferable examples of the dye include the infrared absorbers having an onium salt structure disclosed in Paragraphs 0018 to 0034 of JP-A 11-291652.

Next, infrared absorbers which may be used when the image forming material of the present invention has a positive type recording layer will be described.

When an infrared absorber is used in the positive type recording layer, it is necessary to produce a positive effect (i.e., development is suppressed for unexposed portions and development is promoted for exposed portions by lifting the suppressions) by an interaction between the infrared absorber and a binder polymer having a specific functional group. In this regard, infrared absorbers having an onium salt structure are particularly preferable. Specifically, among infrared absorbers which can be used in the case of the aforementioned negative type recording layer, cyanine dyes and pyrylium salts are particularly preferable. The details of cyanine dyes and pyrylium salts are as described above.

Further, the anionic infrared absorbers disclosed in JP-A 10-237634 may also be preferably used. These anionic infrared absorbers are those in which the mother nucleus of a dye which substantially absorbs infrared rays has not a cationic structure but an anionic structure.

Examples of such an infrared absorber include (a-1) anionic metal complexes and (a-2) anionic phthalocyanines.

Here, the (a-1) anionic metal complexes are those in which a center metal in the complex portion which substantially absorbs light and a ligand exhibits an anionic nature as a whole.

The (a-2) anionic phthalocyanines are those in which an anionic group such as sulfonic acid, carboxylic acid or phosphonic acid as a substituent is bonded to a phthalocyanine skeleton and which exhibit an anionic nature as a whole.

Further, the anionic infrared absorber represented by the formula $[Ga^{-}\text{-}M\text{-}Gb]_mX^{m+}$ (where $Ga^{-}$ represents an anionic substituent, Gb represents a neutral substituent, $X^{m+}$ represents a cation having 1 to m valences including a proton and m denotes an integer from 1 to 6) disclosed in paragraphs 0014 to 0105 of Japanese Patent Application No.10-237634, may also be used.

The infrared absorber used for the positive type recording layer is preferably a dye, and suitable examples include the infrared absorbers having an onium salt structure disclosed in paragraphs 0018 to 0034 of JP-A 11-291652.

The positive type recording layer according to the present invention may include dyes, pigments or the like (infrared absorbers which may be used for the above negative recording layer) in addition to the aforementioned cyanine dyes, pyrylium salts and anionic dyes, for the purpose of improving sensitivity and development latitude.

In the present invention, the infrared absorber is added in an amount of preferably 0.01 to 50% by weight, more preferably 0.1 to 20% by weight and still more preferably 0.5 to 15% by weight based on the total solid of the recording layer. When the amount is less than 0.01% by weight, it becomes easy for problems to arise in image formability, whereas when the amount exceeds 50% by weight, there is a tendency for contamination to be generated caused in non-image portions.

As described above, when desired components such as the initiator and the infrared absorber are contained in the aforementioned latex, these may be added together with raw materials when latex particles are formed or may be introduced after the latex is formed.

Examples of a method of introducing these desired components after the formation of a latex is finished include a method in which desired components such as an initiator, dyes and a crosslinkig agent to be introduced are dissolved in an organic solvent and the mixture is added to a dispersing medium of a latex dispersed in a water.

Also, when the recording layer according to the present invention is used as a negative type, it is essential to contain a compound which can form a crosslinking structure by the aid of a crosslinking agent, namely, a crosslinking initiator, or a polymerizable compound capable of being polymerized by a polymerization initiator, together with the aforementioned initiator in the recording layer. Examples of the crosslinking agent which is preferably used in the present invention include compounds having two or more hydroxymethyl, alkoxymethyl, epoxy or vinyl ether groups in a molecule and preferably those in which each of these crosslinkable functional groups is bonded directly to an aromatic ring. Specific examples of the crosslinking agent include methylol melamine, resol resins, epoxidized novolac resins and urea resins. Further, preferable examples include the compounds *Kakyôzai Handobukku* ("Cross-linking Agents Handbook", Shinzô Yamashita and Kaneko Tôsuke, published by Taiseisha) and the compounds disclosed in Japanese Patent Application No. 11-151412. In particular, phenol derivatives having in the molecules thereof two or more hydroxymethyl groups or alkoxymethyl groups are preferable since the strength of image portions at the time of image formation is excellent. Examples of such a phenol derivative include resol resins.

Examples of polyfunctional polymerizable monomers to be used preferably as the compound which can form a crosslinking structure or is capable of a polymerization reaction include acrylate monomers such as ethylene glycol diacrylate, triethylene glycol diacrylate, 1,3-butane diol diacrylate, tetramethylene glycol diacrylate, propylene glycol diacrylate, neopentylglycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers and epoxy monomers such as trimethylolpropane polyglycidyl ether, neopentyl glycol diglycidyl ether, glycerol polyglycidyl ether, ethylene glycol diglycidyl ether, sorbitol polyglycidyl ether, 1,4-cyclohexanedimethanol diglycidyl ether, triphenylolmethane triglycidyl ether and tetraphenylolethane glycidyl ether.

The following compounds are given as examples of the crosslinkng agent disclosed in Japanese Patent Application No. 11-151412.

(i) Aromatic compounds substituted with an alkoxymethyl group or a hydroxymethyl group (ii) Compounds having an N-hydroxymethyl group, N-alkoxymethyl group or N-acyloxymethyl group (iii) Epoxy compounds The above crosslinking agent or polymerizable compound is contained in an amount of 5 to 80% by weight, preferably 10 to 75% by weight and more preferably 20 to 70% by weight based on the total solid content of the negative type recording layer. When the amount of the crosslinking agent is less than 5% by weight, the durability of the resulting recording layer is impaired, whereas when an amount exceeding 80% by weight is unpreferable in view of stability during storage.

Reasons why it is necessary for the photosensitive layer of the image recording material of the present invention to not produce ablation in relation to an infrared laser irradiation device have already been described. However, from the standpoint of ablation prevention, the image forming mechanism of the image forming layer of the present invention is a mechanism in which ablation is not utilized, energy from an infrared laser is converted to heat, and the solubility of the recording layer in alkaline water is changed by the heat. As regards the polymer material that is the binder forming such an image recording layer, any polymer material may be used as long as the solubility thereof in alkaline water (i.e., an alkali developing solution) changes by applying heat energy to the polymer material. However, it is preferable to use a polymer that is insoluble in water and soluble in alkaline water from the standpoint of ease of availability and the difficulty with which ablation occurs.

A ceiling temperature (i.e., a temperature at which, in a polymerization reaction of a vinyl compound or the like, the rate of polymerization and the rate of depolymerization become equal) of a polymer having a high ceiling temperature may be selected as an index of the difficult at which ablation occurs. For the sake of convenience, however, the temperature at which the polymer decomposes may be selected as an index. In the present invention, the temperature at which the polymer forming the recording layer decomposes is preferably 150° C. or higher, and more preferably 200° C. or higher. When the decomposition temperature is less than 150° C., the possibility for ablation to occur increases and is therefore not preferable. Further, although it is preferable for the temperature at which components other than the polymer compound contained in the recording layer decompose to be 150° C. or higher, components for which the amount added thereof is small may have a decomposition temperature less than 150° C. as long as such temperatures are within a range in which they do not substantially become a problem.

Although the amount (solid content) of the recording layer to be applied to the support after the recording layer is applied and dried differs depending upon its use, it is preferably in a range between 0.5 and 5.0 $g/m^2$. When the film thickness is less than 0.5 $g/m^2$, the film becomes susceptible to the effect of uneven application, with the result that it is hard to obtain a uniform recording layer. On the other hand, a thick recording layer having a thickness exceeding 5.0 $g/m^2$ is unpreferable because a temperature rise of the recording layer by the same heat energy is low and the effect of heat diffusion easily extends deep to the recording layer resulting in reduced image forming ability in the vicinity of the support.

In the recording layer of the image forming material of the present invention, depending on the object, various known additives may be used in combination in addition to the respective structural components previously described.

Various compounds in addition to the aforementioned compounds may further be added to the recording layer of the image forming material of the present invention as needed.

For example, dyes having large absorption in the visible light region may be used as an image coloring agent. Specific examples of these dyes include Oil Yellow #101, Oil Yellow #103, Oil Pink #312, Oil Green BG, Oil Blue BOS, Oil Blue #603, Oil Black BY, Oil Black BS and Oil Black T-505 (the above products are manufactured by Orient Chemical Industries), Victoria Pure Blue, Crystal Violet (CI42555), Methyl Violet (CI42535), Ethyl Violet, Rhodamine B (CI145170B), Malachite Green (CI42000), Methylene blue (CI52015), Aizen Spiron Blue C-RH (manufactured by Hodogaya Chemical) and the dyes disclosed in JP-A 62-293247.

The addition of these additives ensures that discrimination between image portions and non-image portions is made clear after an image is formed, and is hence preferable. The amount to be added is preferably in a range from 0.01 to 10% by weight based on the total solid content of the recording layer.

In the recording layer according to the present invention, the nonionic surfactants disclosed in JP-A 62-251740 and JP-A 3-208514, and the amphoteric surfactants disclosed in JP-A 59-121044 and JP-A 4-13149, may be added to broaden the stability of processing with respect to developing conditions.

Specific examples of the nonionic surfactant include sorbitan tristearate, sorbitan monopalmitate, sorbitan trioleate, stearic acid monoglyceride and polyoxyethylene nonylphenyl ether.

Specific examples of the amphoteric surfactant include alkyldi(aminoethyl)glycine, alkylpolyaminoethylglycine hydrochloride, 2-alkyl-N-carboxyethyl-N-hydroxyethylimidazoliniumbetaine and N-tetradecyl-N,N-betaine types (e.g., Amorgen K (trademark), manufactured by Daiichi Kogyo).

The proportion occupied by the nonionic surfactant and the amphoteric surfactant in the recording layer is preferably 0.05 to 15% by weight and more preferably 0.1 to 5% by weight.

Moreover, in the recording layer of the image forming material, a plasticizer may be added as required to provide flexibility to the coating film. For example, polyethylene glycol, tributyl citrate, diethyl phthalate, dibutyl phthalate, dihexyl phthalate, dioctyl phthalate, tricresyl phosphate, tributyl phosphate, trioctyl phosphate or tetrahydrofurfuryl oleate may be used.

In the image forming material of the present invention, the respective components described above are usually dissolved in a solvent and applied to a proper substrate to form a recording layer.

Examples of the solvent to be used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. These solvents may be used singly or by mixing two or more. The concentration of the above components (total solid content including additives) is preferably 1 to 50% by weight.

The amount (solid content) of the recording layer according to the present invention which is applied to the support is adjusted to a range of 0.5 to 5.0 $g/m^2$, though it differs depending on the purpose.

Various methods may be used as a method for application. Examples of these methods may include bar coater coating, rotary coating, spray coating, curtain coating, dip coating, air knife coating, blade coating and roll coating. Apparent sensitivity is increased as the application amount becomes smaller, but the film characteristics of the image recording film are lowered.

In the recording layer in the present invention, a surfactant to improve coatability, such as the fluorine type surfactant disclosed in JP-A 62-170950, may be added. A preferable amount to be applied is 0.01 to 1% by weight and more preferably 0.05 to 0.5% by weight based on the total solid content of the recording layer.

Examples of the support which can be used in the present invention include dimensionally stable plate materials such as paper, paper on which a plastic (e.g., a polyethylene, polypropylene and polystyrene) is laminated, metal plates (e.g., aluminum, zinc or copper), plastic films (e.g., cellulose diacetate, cellulose triacetate, cellulose propionate, cellulose butyrate, cellulose acetate lactate, cellulose nitrate, polyethylene terephthalate, polyethylene, polystyrene, polypropylene, polycarbonate and polyvinylacetal) and paper or plastic films on which such a metal as aforementioned is deposited or laminated.

Preferable examples of the substrate include polyester films or aluminum plates. Among these materials, aluminum plates that are dimensionally highly stable and relatively inexpensive are particularly preferable. Examples of preferable aluminum plates include a pure aluminum plate, an alloy plate having aluminum as its major component and minute amounts of other elements, or a plastic film on which aluminum is laminated or deposited. Examples of the foreign elements that may be contained in the aluminum alloy include silicon, iron, manganese, copper, magnesium, chromium, zinc, bismuth, nickel and titanium. The amount of the foreign elements in the alloy is 10% by weight or less in total.

Pure aluminum is particularly suitable for the present invention. However, because completely pure aluminum is extremely difficult to manufacture from the standpoint of refinement technology, aluminum that contains slight amounts of dissimilar elements may also be used. There are no particular limitations on the composition of the aluminum plate used in the present invention, and an aluminum plate formed of conventionally known and commonly used materials may appropriately be used.

Prior to roughening the surface of the aluminum plate, a degreasing treatment with a surfactant, an organic solvent, or an alkaline water solution may be administered to the aluminum plate in order to eliminate rolling oil on the surface as needed.

The surface of the aluminum plate may be roughened in accordance with various methods. Examples thereof include a method in which the surface is mechanically roughened, a method in which the surface is electrochemically dissolved and roughened, and a method in which the surface is chemically roughened by selectively dissolving the surface.

Following alkaline etching and neutralization processing as needed, the aluminum plate thus roughened may be subjected to anodic oxidation as desired in order to raise the water retention and wear resistance of the surface.

Although anodic oxidation treatment conditions cannot be unconditionally specified because they change depending on the type of electrolyte to be used, in general, a proper range for each condition is as follows: the density of an electrolyte in a solution: 1 to 80% by weight, solution temperature: 5 to 70° C., current density: 5 to 60 $A/dm^2$, voltage: 1 to 100 V, electrolytic time: 10 seconds to 5 minutes. When the amount of anodic oxidized film is smaller than 1.0 $g/m^2$, film durability is insufficient and non-image portions are easily damaged. Particularly in the case of a planographic printing plate, so-called “flaw stain”, namely, a phenomenon in which ink sticks to a flaw portion during printing, tends to occur.

The surface of aluminum may be subjected to a hydrophilic treatment as needed after it has been subjected to the anodic oxidation treatment. Examples of the hydrophilic treatment usable in the present invention include the methods using an alkali metal silicate (e.g., an aqueous sodium silicate) as disclosed in U.S. Pat. No. 2,714,066, No. 3,181,461, No. 3,280,734 and No. 3,902,734. In these methods, a support is subjected to a dipping treatment or an electrolytic treatment using an aqueous sodium silicate solution. In addition to this method, the method of treatment using fluorinated potassium zirconate as disclosed in JP-B 36-22063 and a method of treatment using polyvinylphosphonic acid as disclosed in U.S. Pat. No. 3,276,868, No. 4,153,461 and No. 4,689,272 may be used.

An undercoat layer may be formed as needed on the support prior to the application of the aforementioned recording layer.

A variety of organic compounds may be used as components for the undercoat layer. The organic compound is selected from carboxymethyl cellulose, dextrin, gum arabic, phosphonic acids having an amino group such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid which may have a substituent; organic phosphoric acid such as phenylphosphoric acid, naphthylphosphoric acid, alkylphosphoric acid and glycerophosphoric acid which may have a substituent; organic phosphinic acid such as phenylphosphinic acid, naphthylphosphinic acid, alkylphosphinic acid and glycerophosphinic acid which may have a substituent; amino acids such as glycine and β-alanine and hydrochlorides of an amine having a hydroxyl group such as a hydrochloride of triethanolamine. These acids may be used by mixing two or more. Also, the aforementioned diazonium compound is preferably applied as an undercoat.

The amount of the organic undercoat layer is appropriately 2 to 200 mg/m$^2$ and preferably 5 to 100 mg/m$^2$. When the above amount to be applied is less than 2 mg/m$^2$, sufficient film properties can not be obtained, and when the amount exceeds 200 mg/m$^2$, the results are the same.

In this manner, the image forming material of the present invention may be used as a planographic printing plate. Recording is preferably conducted using an infrared laser. Specifically, it is preferable that image exposure is conducted using a solid-state laser or semiconductor laser having that emits an infrared ray having a wavelength of 760 nm to 1200 nm.

When the image forming material of the present invention has the aforementioned positive or negative type recording layer, developing treatment using water or an alkali developing solution is carried out after it is exposed. Although the developing treatment may be performed just after the exposure treatment, heat treatment may be performed between the exposure step and the developing step. When a heat treatment is administered, it is preferable that the temperature is within a range of 60° C. to 150° C. and that the heat treatment is conducted for 5 seconds to 5 minutes. Various, conventionally known methods may be employed. Examples thereof include a method in which the recording materials are heated by a panel heater or a ceramic heater while the heater is brought into contact with the recording materials, and a method in which the recording materials are heated by a lamp or warm air without contact. By conducting such a heat treatment, laser energy required for recording at the time of laser irradiation can be reduced.

As the developing solution, an aqueous alkaline solution is preferable. A preferable pH range of the aqueous alkaline solution is between 10.5 and 12.5. Developing treatment using an aqueous alkaline solution with a pH ranging from 11.0 to 12.5 is more preferable. When a solution with a pH less than 10.5 is used as the aqueous alkaline solution, there is a tendency that a non-image portion is easily contaminated whereas when an aqueous solution with a pH exceeding 12.5 is used to carry out developing treatment, there is a fear that the strength of an image portion is decreased.

Conventionally known aqueous alkaline solution may be used as the developing solution and replenishing solution. Examples of the solution include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Also, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyrimidine are used.

These alkali agents are used singly or in combinations of two or more.

An automatic developing machine may be used for development. When the machine is used, the developing agent whose alkaline strength is same as that of the developing solution can be used. Further, when the machine is used, it is known that a large amount of planographic printing plates can be processed without changing developing solutions in the developing tank over a long period of time by adding to the developing solution an aqueous solution (replenishing solution) whose alkaline strength is greater than that of the developing solution.

Various surfactants and organic solvents may be added as required to the developing solution and the replenishing solution with the intention of promoting or restricting the developing ability and improving the dispersion of developing residues and the affinity of the printing plate image portion to ink.

In the developing solution, the surfactant is added in an amount ranging from preferably 1 to 20% by weight and more preferably 3 to 10% by weight. When the amount of the surfactant to be added is less than 1% by weight, an only insufficient effect of improving developing ability is obtained. When the surfactant is added in an amount exceeding 20% by weight, harmful effects such as a reduction in the strength, for example, the wear resistance of an image tend to be produced.

Given as preferable examples of the surfactant are anionic, cationic, nonionic and amphoteric surfactants. Specific examples of the surfactant include a sodium salt of lauryl alcohol sulfate, ammonium salt of lauryl alcohol sulfate, sodium salt of octyl alcohol sulfate, alkyl aryl sulfonates (such as a sodium salt of isopropylnaphthalenesulfonic acid, sodium salt of isobutylnaphthalenesulfonic acid, sodium salt of polyoxyethylene glycol mononaphthylethylsulfuric acid ester, sodium salt of dodecylbenzenesulfonic acid and sodium salt of methanitrobenzenesulfonic acid), sulfuric acid esters of higher alcohol having 8 to 22 carbon atoms (such as disodium alkyl sulfate), aliphatic alcohol phosphates (such as a sodium salt of cetyl alcohol phosphoric acid ester), sulfonates of alkylamide (such as $C_{17}H_{33}CON(CH_3)CH_2CH_2SO_3Na$), sulfonates of dibasic aliphatic ester (such as sodium dioctyl sulfosuccinate and sodium dihexyl sulfosuccinate), ammonium salts (such as lauryltrimethylammonium chloride and lauryltrimethylammonium methasulfate), amine salts (such as stearamideethylamine acetate), polyhydric alcohols (such as fatty acid monoester of glycerol and fatty acid monoester of pentaerythritol) and polyethylene glycol ethyls (such as polyethylene glycol mononaphthylethyl and polyethylene glycol mono(nonylphenol)ethyl).

As preferable examples of the organic solvent, those whose solubility in water is 10% by weight or less are given. It is more preferable that the organic solvent be selected from those whose solubility in water is 5% by weight or less. Given as examples of the organic solvent are 1-phenyl ethanol, 2-phenyl ethanol, 3-phenyl propanol, 1,4-phenyl butanol, 2,2-phenyl butanol, 1,2-phenoxy ethanol, 2-benzyloxy ethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The content of the organic solvent is properly 1 to 5% by weight based on the total weight of a developing solution when it is used. The amount of the organic solvent to be used is intimately related to the amount of the surfactant to be used. It is preferable that the amount of the surfactant be increased with an increase in the amount of the organic solvent. This is because if the organic solvent is used in an excessive amount in the condition that the amount of the surfactant is small, the organic solvent is not dissolved with the result that it is not expected to secure high developing ability.

Moreover, the developing solution and the replenishing solution may contain additives such as an anti-foaming agent and water softener. Examples of the water softener may include polyphosphates such as $Na_2P_2O_7$, $Na_5P_3O_3$, $Na_3P_3O_9$, $Na_2O_4P(NaO_3P)PO_3Na_2$; Calgon (sodium polymethaphosphate); aminopolycarboxylic acids such as ethylcnediaminetetraacetic acid, its potassium salt and sodium salt; diethylenetriaminepentaacetic acid, its potassium salt and sodium salt; triethylenetetraminehexaacetic acid, its potassium salt and sodium salt; hydroxyethylethylenediaminetriacetic acid, its potassium salt and sodium salt; nitrilotriacetic acid, its potassium salt and sodium salt; 1,2-diamlinocyclohexanet etraacetic acid, its potassium salt and sodium salt; and 1,3-diamino-2-propanoltetraacetic acid, its potassium salt and sodium salt and organic phosphonic acids such as 2-phosphonobutanetricarboxylic acid-1,2,4, its potassium salt and sodium salt; 2-phosphonobutanonetricarboxylic acid-2,3,4, its potassium salt and sodium salt; 1-phosphonoethanetricarboxylic acid-1,2,2, its potassium salt and sodium salt; 1-hydroxyethane-1,1-diphosphonic acid, its potassium salt and sodium salt; and aminotri(methylenephosphonic acid), its potassium salt and sodium salt. Although the optimum amount of such a water softener varies corresponding to the hardness of hard water to be used and to the amount of the hard water, the water softener may be contained in an amount of 0.01 to 5% by weight and more preferably 0.01 to 0.5% by weight in the developing solution when it is used.

Moreover, when the planographic printing plate is developed using an automatic developing machine, the developing solution is getting fatigue corresponding to the throughput. In this case, a replenishing solution or a fresh solution may be used to recover the processing capacity. In this case, it is preferable to carry out the replenishing according to a method described in U.S. Pat. No. 4,882,246.

Examples of such a developing solution containing the surfactant, organic solvent, reducing agent and the like include a developing solution composition comprising benzyl alcohol, an anionic surfactant, an alkali agent and water as described in JP-A No. 51-77401, a developing solution composition comprising an aqueous solution containing benzyl alcohol, an anionic surfactant and a water-soluble sulfite as described in JP-A No. 53-44202 and a developing solution composition containing an organic solvent whose solubility in water is 10% by weight or less at ambient temperature, an alkali agent and water as described in JP-A No. 55-155355. These compositions may be preferably used in the present invention.

The recording layer developed using the aforementioned developing solution and replenishing solution is post processed with washing water, a rinse solution containing a surfactant, and a grease-insensitizing solution containing gum arabic or a starch derivative. These treatments are used by variously combining them as a post-processing when the recording layer according to the present invention is used for a printing plate.

In recent years, automatic developing machines for plate materials in printing have come to be used widely, particularly in the plate-making and printing industries, because of the rationalization and standardization of plate-making labor.

The automatic developing machine generally comprises a development section and a post-processing section, and has a device that conveys plate material for printing, various processing fluid tanks and a spray device. A printing plate once exposed is sprayed with various processing fluids that have been drawn up by pumps and sprayed out from spray nozzles while the plate is conveyed horizontally, whereby developing processing is carried out. Recently, a method has come to be known in which printing materials are dipped and conveyed by guide rolls in processing fluid tanks filled with processing fluids. In this type of automated processing, processing can be carried out by replenishing the various processing fluids with replenishing fluids in accordance with processing amount, operation time and the like.

Also, a so-called disposable processing method using a substantially unused process solution to carry out treatment can be applied.

When the image forming material obtained in the above manner is used as a planographic printing plate, a grease-insensitizing gum is applied as desired to the image forming material, which may be then subjected to a printing step. Burning treatment may be performed with the intention of further improving printing durability.

When a planographic printing plate is treated by burning, it is preferable to treat the planographic printing plate by using a surface regulating solution prior to the burning as disclosed in JP-B 61-2518, JP-B 55-28062, JP-A 62-31859 and JP-A 61-159655.

The planographic printing plate coated with the surface regulating solution is dried as required and is then heated to high temperatures by using a burning processor (e.g., Burning Processor: BP-1300, commercially available from Fuji Photo Film). Heating temperature and time in this case are preferably in a range from 180 to 300° C. and in a range from 1 to 20 minutes respectively though these conditions differ depending upon the type of component forming an image.

The planographic printing plate which has been treated by burning may be subjected appropriately to treatments which are conventionally performed such as washing and gum-drawing according to the need. In the case where a surface regulating solution containing an aqueous polymer compound and the like is used, the so-called grease-insensitizing treatment such as gum-drawing can be omitted.

The planographic printing plate obtained by the aforementioned treatments is subjected to an offset printer and used to print a number of sheets.

EXAMPLES

The present invention will hereinafter be described in detail with reference to Examples. However, the present invention is not limited to the same.

Examples 1 and 2

Preparation of Support A

An aluminum plate (material 1050) having a thickness of 0.30 mm was cleansed with trichloroethylene and degreased. The surface of the aluminum plate was then grained using a nylon brush and an aqueous suspension of 400 mesh paristone, and thoroughly washed with water. The aluminum plate was dipped into a 25% aqueous solution of sodium hyrdoxide for 9 seconds, etched, washed, then further dipped into a 2% aqueous solution of $HNO_3$ for 20 seconds and washed. The etching amount of the grained surface at this time was about 3 g/$m^2$. Next, using 7% $H_2SO_4$ as an electrolyte, the plate was disposed with a direct current anodic oxidized film of 3 g/$m^2$ at an electric current density of 15 A/$dm^2$. Thereafter, the plate was immersed in a 2.5% aqueous solution of sodium silicate at 70° C. for 1 minute, then washed with water and dried. Next, an undercoat solution having the following composition was applied to this aluminum plate and then dried at 80° C. for 30 seconds. The amount of the dried coat was 20 mg/$m^2$.

| <Undercoat solution> | |
|---|---|
| Dibutylnaphthalenesulfonic acid of a condensate of 4-diazophenylamine, phenoxyacetic acid and formaldehyde | 0.1 g |
| Methanol | 100 g |

Next, recording layer coating solutions (I) and (II) having the compositions shown below were respectively prepared and applied to the aforementioned aluminum plates that had been undercoated. Each coating solution was dried at 140° C. for 2 minutes to obtain image forming materials (1.2 g/$m^2$) having a positive type recording layer as Example 1 and Example 2. Because two types of mutually incompatible recording layer coating solutions were used as a polymer compound or a monomer that is a precursor of the polymer compound, it was confirmed by an SEM that a novolac resin or a polymer compound PD-1 formed a dispersion phase in the recording layer that was formed.

The length of the dispersion phase is shown in Table 1. Also, the recording layer used here was immersed in methanol to extract a novolac resin, polymer compound PD-1 or polyhydroxystyrene which formed the dispersion phase. An infrared absorber contained in these extracted compounds was then measured using UV. The results are shown together in Table 1.

| (Coating solution I for a positive type recording layer) | |
|---|---|
| Acrylic acid/benzylmethacrylate (2.5/7.5) MW = 54,000 | 1.5 g |
| UP-1 (structure: shown below) | 0.5 g |
| Polymer compound PD-1 (Mw 3,000, structure: shown below) | 0.7 g |
| Infrared absorber DX-2 (structure: shown below) | 0.2 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methanol | 20 g |

UP-1

The mixture of 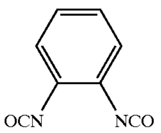 and 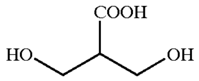

PD-1

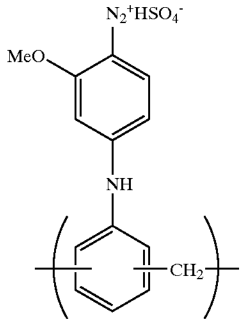

DX-2

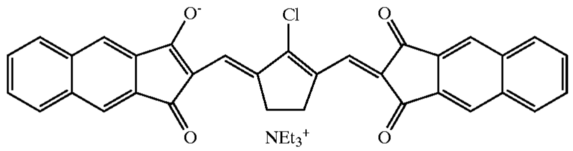

| (Coating solution II for a positive type recording layer) | |
|---|---|
| UP-1 (structure: shown above) | 2 g |
| Polyhydroxystyrene (PHS, Mw = 25,000) | 1.5 g |
| Infrared absorber DX-1 (structure: shown below) | 0.2 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |

DX-1

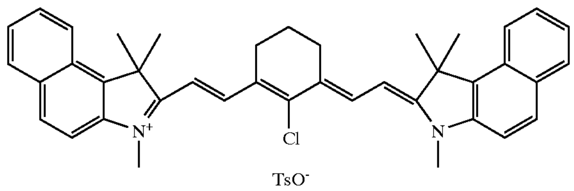

Comparative Examples 1 to 3

Next, coating solutions (CI), (CII) and (CIII) for a recording layer which had the compositions shown below were respectively prepared and each solution was applied to the aforementioned aluminum plates which had been undercoated. Each coating solution was dries at 140° C. for 2 minutes to obtain image forming materials (1.2 g/$m^2$) having a positive type recording layer as Comparative Examples 1 to 3.

| (Coating colution CI for a positive type recording layer) | |
|---|---|
| Acrylic acid/benzylmethacrylate (2.5/7.5) MW = 54,000 | 3.5 g |
| Infrared absorber DX-1 | 0.2 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |
| (Coating solution CII for a positive type recording layer) | |
| Polyhydroxystyrene | 3.0 g |
| Infrared absorber DX-1 | 0.2 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |
| (Coating solution CIII for a positive type recording layer) | |
| UP-1 | 3.0 g |
| Infrared absorber DX-1 | 0.2 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |

<Evaluation of Sensitivity>

The planographic printing plates obtained in Examples 1 and 2 and Comparative Examples 1 to 3 were scanned using a semiconductor laser emitting an infrared ray having a wavelength of about 830 nm to 850 nm. After being exposed, each plate was developed using a developing solution DN-3C (diluted with water, the ratio of developing solution to water=1:2) manufactured by Fuji Photo Film co., Ltd., or a developing solution DP-4 (diluted with water, the ratio of developing solution to water=1:8) manufactured by Fuji Photo Film co., Ltd., followed by washing. The amount of energy required for recording was calculated based on the line width of the resultant images, output of the laser, loss in the optical system and scanning speed. The results are shown in Table 1.

TABLE 1

| | Dispersion phase length (μm) | Exposure value ($mJ/cm^2$) | Infrared absorber in dispersion phase (%) |
|---|---|---|---|
| Example 1 | 0.3 | 115 | 72 |
| Example 2 | 0.4 | 120 | 74 |
| Comparative Example 1 | — | No image was formed | — |
| Comparative Example 2 | — | 175 | — |
| Comparative Example 3 | — | No image was formed | — |

As is clear from Table 1, it was confirmed that the image forming materials of the Examples in which a dispersion phase was formed were highly sensitive even though the recording layer in each of these materials contained the same infrared absorber in the same amount. Also, the recording layer of the image forming material of the Examples after being developed was observed visually and as a result, it was confirmed that a sharp and highly discriminative image was formed.

Examples 3 to 8

Recording layer coating solutions (III), (IV) and (V) having the compositions shown below were respectively prepared according to the prescriptions shown in Table 2 below and each solution was applied to an aluminum plate which had been undercoated in the same manner as the aluminum plate in Example 1. Each coating solution was dried at 140° C. for 2 minutes to obtain image forming materials (1.2 $g/m^2$) having a positive type recording layer as Examples 3 to 8. Because two types of mutually incompatible recording layer coating solutions were used as a polymer compound or a monomer that is a precursor of the polymer compound, it was confirmed by an SEM that a polymer compound PD-I or polyhydroxystyrene formed a dispersion phase in the recording layer that was formed. The length of the dispersion phase is shown in Table 3. Also, an infrared absorber contained in the dispersion phase used here in the recording layer was measured in the same manner as in Example 1. The results are shown together in Table 3.

| (Coating solution III for a negative type recording layer) | |
|---|---|
| Acrylic acid/benzylmethacrylate (2.5/7.5) MW = 54,000 | 2 g |
| Novolac resin (m/p = 6/4, Mw = 10,000) | 1.5 g |
| Infrared absorber DX-2 | 0.2 g |
| Acid generating agent (compound described in the table below) | 0.1 g |
| Crosslinking agent (compound described in the table below) | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 15 g |
| (Coating solution IV for a negative type recording layer) | |
| Acrylic acid/benzylmethacrylate (2.5/7.5) MW = 54,000 | 2.0 g |
| PD-1 (Mw = 3,000) | 0.7 g |
| Infrared absorber DX-3 | 0.2 g |
| Acid generating agent (compound described in the table below) | 0.1 g |
| Crosslinking agent (compound described in the table below) | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 25 g |
| Methanol | 20 g |
| (Coating solution V for a negative type recording layer) | |
| UP-1 | 2 g |
| Polyhydroxystyrene (m/p = 6/4, Mw = 10,000) | 1.5 g |
| Infrared absorber DX-3 | 0.2 g |
| Acid generating agent (compound described in the table below) | 0.1 g |
| Crosslinking agent (compound described in the table below) | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |

TABLE 2

| | Recording layer coating solution | Crosslinking agent | Acid generating agent |
|---|---|---|---|
| Example 3 | III | R-1 | SX-1 |
| Example 4 | III | R-2 | SX-2 |

TABLE 2-continued

| | | | |
|---|---|---|---|
| Example 5 | IV | R-1 | SX-3 |
| Example 6 | IV | R-3 | SX-1 |
| Example 7 | V | R-1 | SX-2 |
| Example 8 | V | R-1 | SX-3 |
| Comparative Example 4 | CIV | R-1 | SX-1 |
| Comparative Example 5 | CV | R-1 | SX-3 |
| Comparative Example 6 | CVI | R-1 | SX-2 |

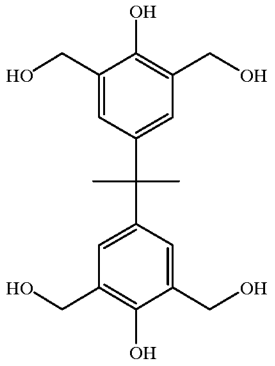

R-1

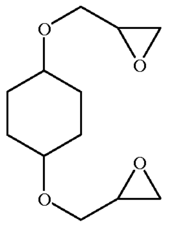

R-2

R-3 Resol resin

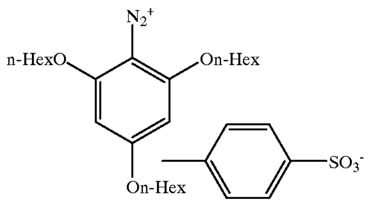

SX-1

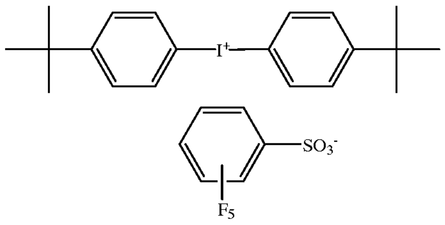

SX-2

TABLE 2-continued

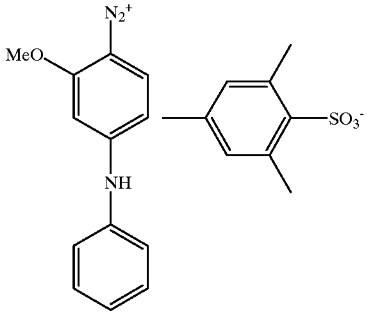

SX-3

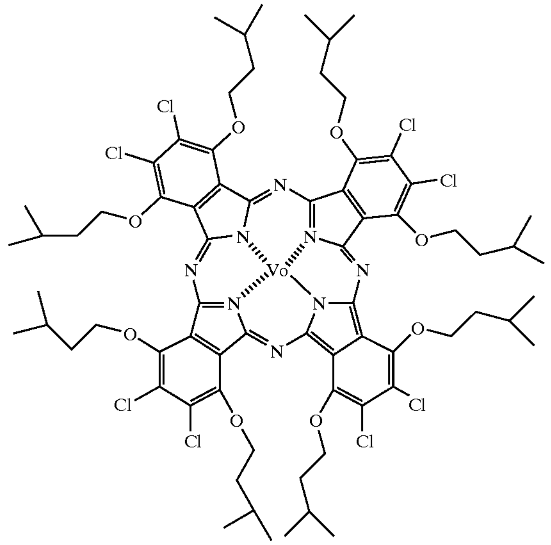

DX-3

Comparative Examples 4 to 6

Next, recorting layer coating solutions (CIV), (CV) and (CVI) having the compositions shown below were respectively prepared and each solution was applied to an aluminum plate which had been undercoated. Each coating solution was dried at 140° C. for 2 minutes to obtain image forming materials (1.2 g/m$^2$) having a negative type recording layer as Comparative Examples 4 to 6.

| (Coating solution CIV for a negative type recording layer) | |
|---|---|
| Novolac resin (m/p = 6/4, Mw = 10,000) | 2.5 g |
| Infrared absorber DX-2 | 0.2 g |
| Acid generating agent SX-1 | 0.1 g |
| Crosslinking agent R-1 | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 15 g |
| (Coating solution CV for a negative type recording layer) | |
| PD-1 (Mw = 3,000) | 2.7 g |
| Infrared absorber DX-1 | 0.2 g |
| Acid generating agent SX-3 | 0.1 g |

-continued

| | |
|---|---|
| Crosslinking agent R-1 | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 25 g |
| Methanol | 20 g |
| (Coating solution CVI for a negative type recording layer) | |
| UP-1 | 3 g |
| Infrared absorber DX-3 | 0.2 g |
| Acid generating agent SX-2 | 0.1 g |
| Crosslinking agent R-1 | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Methyl ethyl ketone | 15 g |
| Methanol | 10 g |

<Evaluation of Sensitivity>

The planographic printing plate obtained in Examples 3 to 8 and Comparative Examples 4 to 6 were exposed using a semiconductor laser supplying and emitting an infrared ray having a wavelength of about 830 nm to 850 nm. After being exposed, each plate was heat-treated at 110° C. for 15 seconds by using a panel heater and then developed using a developing solution DN-3C (diluted with water, the ratio of developing solution to water=1:2) manufactured by Fuji Photo Film co., Ltd., or a developing solution DP-4 (diluted with water, the ratio of developing solution to water=1:8) manufactured by Fuji Photo Film co., Ltd., followed by washing. The amount of energy required for recording was calculated based on the line width of the resultant images, output of the laser, loss in the optical system and scanning speed. The results are shown in Table 3.

TABLE 3

| | Dispersion phase length (μm) | Exposure value (mJ/cm$^2$) | Infrared absorber in dispersion phase (%) |
|---|---|---|---|
| Example 3 | 0.5 | 100 | 74 |
| Example 4 | 0.4 | 110 | 73 |
| Example 5 | 0.3 | 105 | 74 |
| Example 6 | 0.2 | 100 | 74 |
| Example 7 | 0.3 | 100 | 75 |
| Example 8 | 0.3 | 100 | 74 |
| Comparative Example 4 | — | 135 | — |
| Comparative Example 5 | — | No image was formed | — |
| Comparative Example 6 | — | No image was formed | — |

As is clear from Table 3, it was confirmed that the image forming materials of the Examples in which a dispersion phase was formed were more highly sensitive than the image forming materials of corresponding Comparative Examples regardless of the types of infrared absorber, crosslinking agent and acid generating agent. Also, the recording layer of the image forming material of the Examples after being developed was observed visually and as a result, it was confirmed that a sharp and highly discriminative image was formed.

Examples 9 to 13

Synthetic Example

Synthetic Example 1

Latex 1

A flask with three necks was charged with 50 g of styrene, 20 g of trimethoxypropylmethacrylate, 30 g of carbon black (average particle diameter: about 20 nm), 200 g of water and 100 g of a surfactant (W1017, aqueous 4.7% solution) having the following structure. The temperature of the mixture was raised to 80° C. while nitrogen was introduced and the mixture was then stirred for 30 minutes. 1 g of potassium persulfate (hereinafter referred to as KPS) was added to the mixture, which was then emulsion-polymerized at 80° C. for 6 hours to obtain a carbon black resin complex particle having a particle diameter of about 0.1 μm. Further, 5 g of an acid generating agent SX-1 was dissolved in 20 ml of methanol, which was then added to the resulting complex resin particle dispersion. The resulting mixture was stirred at 80° C. for one hour to obtain a latex particle dispersion having a particle diameter of 0.11 μm.

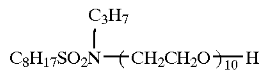

Synthetic Example 2

Latex 2

A flask with three necks was charged with 60 g of styrene, 20 g of trimethoxysilylpropylmethacrylate, 20 g of an infrared absorber (DX-1), 200 g of water and 100 g of a surfactant W1017 (4.7%). The temperature of the mixture was raised to 80° C. while nitrogen was introduced and the mixture was then stirred for 30 minutes. 1 g of KPS was added to the mixture, which was then emulsion-polymerized at 80° C. for 6 hours to obtain an infrared absorbing dye resin complex particle having a particle diameter of about 0.15 μm. Further, 5 g of an acid generating agent SX-1 was dissolved in 20 ml of methanol, which was then added to the resulting complex resin particle dispersion. The resulting mixture was stirred at 80° C. for one hour to obtain a latex particle dispersion having a particle diameter of 0.17 μm.

Synthetic Example 3

Latex 3

20 g of Snowtex C (manufactured by Nissan Chemical) was added to the complex resin particle dispersion of Latex 2 to hetero-coagulate a silica sol fine particle on the surface of the complex resin particle, thereby obtaining a core-shell particle dispersion having a particle diameter of 0.25 μm wherein the core comprised a resin/carbon black complex and the shell comprised silica.

Synthetic Example 4

Latex 4

A flask with three necks was charged with 60 g of styrene, 20 g of trimethoxysilylpropylmethacrylate, 20 g of an infrared absorber (DX-2), 200 g of water and 100 g of a surfactant W1017 (4.7%). The temperature of the mixture was raised to 80° C. while nitrogen was introduced and the mixture was then stirred for 30 minutes. 1 g of KPS was added to the mixture, which was then emulsion-polymelized at 80° C. for 6 hours to obtain an infrared absorbing dye resin complex particle having a particle diameter of about 0.15 μm. Further, 5 g of an acid generating agent SX-1 and 1.0 g of a crosslinking agent R-1 were dissolved in 20 ml of ethanol, which was then added to the resulting complex resin particle dispersion. The resulting mixture was stirred at 80° C. for one hour to obtain a latex particle dispersion having a particle diameter of 0.18 μm.

Synthetic Example 5

Microcapsule 1

60 g of Takenate D110N (capsule wall agent manufactured by Takeda Chemical Industries), 2.2 g of an infrared absorber DX-3, 5 g of an acid generating agent SX-1, 55 g of 1-phenyl-1-xylylethane, 30 g of ethyl acetate, 30 g of methylene chloride, 100 g of an aqueous 8% polyvinyl alcohol solution and 40 g of water were mixed. The mixture was emulsified using an Ace Homogenizer manufactured by Nippon Seiki at 15,000 rpm for 15 minutes. Further, 150 g of water was added to the mixture, which was then reacted at 40° C. for 3 hours to prepare a capsule dispersion in which the infrared absorber and the acid generating agent were encapsulated and the size of the capsule was 0.6 μm.

Using the latex dispersion or microcapsule dispersion obtained in the aforementioned synthetic examples, coating solutions (VI) for a recording layer which had the following composition were prepared according to the formulation shown in Table 4 described below. Each solution was applied to the aforementioned aluminum plate which had been undercoated and dried at 140° C. for 2 minutes to obtain image forming materials (1.2 $g/m^2$) as Examples 10 to 14.

| (Coating solution VI for a recording layer) | |
|---|---|
| Novolac resin (m/p = 6/4, Mw = 10,000) | 2.5 g |
| Dispersion (dispersion described in the table below) | 7.5 g |
| Crosslinking agent (compound described in the table below) | 0.7 g |
| Fluorine type surfactant (Megafac F-177, manufactured by Dainippon Ink and Chemicals) | 0.06 g |
| Colorant (VPB-Naps: manufactured by Hodogaya Chemical) | 0.04 g |
| 1-Methoxy-2-propanol | 20 g |
| Water | 15 g |
| Methanol | 15 g |

TABLE 4

| | Recording layer coating solution | Crosslinking agent | Dispersion phase (dispersion) |
|---|---|---|---|
| Example 9 | VII | R-2 | Latex 1 |
| Example 10 | VII | R-1 | Latex 2 |
| Example 11 | VII | R-1 | Latex 3 |
| Example 12 | VII | R-1 | Latex 4 |
| Example 13 | VII | R-3 | Microcapsule |

<Evaluation of Sensitivity >

The image forming materials having a negative type recording layer which were obtained in Examples 9 to 13 were exposed, developed and washed under the same conditions as in Example 3. The amount of energy required for recording was calculated based on the line width of the resultant image, output of the laser, loss in the optical system and scanning speed. The results are shown in Table 5. In this example, the amount of the infrared absorber which was contained locally in the dispersion phase was also measured in the same manner as in Example 1. The results are shown in Table 5.

TABLE 5

| | Dispersion phase length (μm) | Exposure value ($mJ/cm^2$) | Infrared absorber in dispersion phase (%) |
|---|---|---|---|
| Example 9 | 0.11 | 105 | 97 |
| Example 10 | 0.17 | 100 | 98 |
| Example 11 | 0.25 | 110 | 97 |
| Example 12 | 0.18 | 95 | 97 |
| Example 13 | 0.6 | 110 | 95 |

As is clear from Table 5, the image forming materials of the present invention all attained high sensitivity. Also, the recording layer of the image forming material of the Examples after being developed was observed visually and as a result, it was confirmed that a highly discriminative and sharp image was formed.

What is claimed is:

1. An infrared-sensitive image forming material comprising a support and a recording layer disposed thereon whose solubility in an aqueous alkaline solution is altered by irradiation with an infrared laser, wherein the recording layer has a binder phase formed of a polymer compound, a dispersion phase that is dispersed in the binder phase, and an infrared absorbent present in either one of the binder phase and the dispersion phase, and a mass of the infrared absorbent present in the dispersion phase is greater than a mass of the infrared absorbent present in the binder phase, and the recording layer contains a compound which generates one of an acid and a radical upon being irradiated with an infrared laser.

2. The infrared-sensitive image forming material according to claim 1, wherein the mass of the infrared absorbent present in the dispersion phase is no less than 70% by mass of the total incorporated amount of the infrared absorbent in the recording layer.

3. The infrared-sensitive image forming material according to claim 1, wherein the dispersion phase comprises a polymer compound that is incompatible with the polymer compound forming the binder phase.

4. The infrared-sensitive image forming material according to claim 1, wherein the dispersion phase is one of a latex and a microcapsule.

5. The infrared-sensitive image forming material according to claim 1, wherein the dispersion phase has a configuration in which a maximum length is 0.1 μm to 0.8 μm and an average length is 0.05 μm to 0.6 μm.

6. An infrared-sensitive image forming material comprising a support and a recording layer disposed thereon whose solubility in an aqueous alkaline solution is altered by irradiation with an infrared laser, wherein the recording layer has a binder phase formed of a polymer compound, a dispersion phase that is dispersed in the binder phase, and an infrared absorbent present in either one of the binder phase and the dispersion phase, a mass of the infrared absorbent present in the dispersion phase is greater than a mass of the infrared absorbent present in the binder phase, wherein at least one of the binder phase and the dispersion phase comprises a polymer compound that is insoluble in water and soluble in an aqueous alkaline solution, the recording layer has a compound which generates one of an acid and a radical upon being irradiated with an infrared laser, and at least one of the binder phase and the dispersion phase comprises a polymer compound in which one of polymerization and a cross-linking reaction occurs by an action of one of the acid and the radical to lower solubility in an aqueous alkaline solution.

7. An infrared-sensitive image forming material comprising a support and a recording layer disposed thereon whose solubility in an aqueous alkaline solution is altered by irradiation with an infrared laser, wherein the recording layer has a binder phase formed of a polymer compound, a dispersion phase that is dispersed in the binder phase, and an infrared absorbent present in either one of the binder phase and the dispersion phase, and a mass of the infrared absorbent present in the dispersion phase is greater than a mass of the infrared absorbent present in the binder phase wherein the recording layer has a compound that is cross-linked by an action of one of an acid and a radical, and with which a negative-type image can be formed by the recording layer being hardened by irradiation with an infrared laser.

8. The infrared-sensitive image forming material according to claim 1, wherein the binder phase comprises a polymer compound that is selected from a urethane polymer compound, an acryl polymer compound, a styrene polymer compound, a novolac resin, a diazo resin, an amide polymer compound and a polyether compound.

9. The infrared-sensitive image forming material according to claim 1, wherein the dispersion phase comprises a polymer compound that is selected from a urethane polymer compound, an acryl polymer compound, a styrene polymer compound, a novolac resin, a diazo resin, an amide polymer compound and a polyether compound.

10. The infrared-sensitive image forming material according to claim 1, wherein the binder phase comprises a novolac resin and the dispersion phase comprises one of a latex and a microcapsule.

11. The infrared-sensitive image forming material according to claim 1, wherein the binder phase comprises a urethane polymer compound and the dispersion phase comprises a styrene polymer compound.

12. The infrared-sensitive image forming material according to claim 1, wherein the binder phase comprises an acryl compound and the dispersion phase comprises a polymer compound that is selected from a urethane polymer compound, a styrene polymer compound, a novolac resin and a diazo resin.

13. The infrared-sensitive recording material according to claim 1, wherein the infrared absorbent comprises an infrared-absorbing dye.

14. The infrared-sensitive recording material according to claim 1, wherein a mass of the compound, which generates one of an acid and a radical, present in the dispersion phase is greater than a mass of the compound, which generates one of an acid and a radical, present in the binder phase.

15. The infrared-sensitive recording material according to claim 1, wherein the infrared absorbent is a cyanine dye.

16. The infrared-sensitive recording material according to claim 1, wherein the compound which generates one of an acid and a radical is an onium salt.

17. The infrared-sensitive recording material according to claim 15, wherein the compound which generates one of an acid and a radical is an onium salt.

18. The infrared-sensitive recording material according to claim 17, wherein the dispersion phase is formed of one of a latex and a microcapsule.

19. The infrared-sensitive recording material according to claim 1, wherein the recording layer further comprises a compound that is crosslinkable by an action of one of the acid and the radical.

20. The infrared-sensitive recording material according to claim 17, wherein the recording layer further comprises a compound that is crosslinkable by an action of one of the acid and the radical.

* * * * *